(12) United States Patent
Han et al.

(10) Patent No.: US 12,144,218 B2
(45) Date of Patent: Nov. 12, 2024

(54) DISPLAY SUBSTRATE AND DISPLAY DEVICE WITH DISPLAY UNIFORMITY

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Shikai Qin, Beijing (CN); Yi Zhang, Beijing (CN); Yang Zhou, Beijing (CN); Meng Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 779 days.

(21) Appl. No.: 17/297,484

(22) PCT Filed: Aug. 10, 2020

(86) PCT No.: PCT/CN2020/108102
§ 371 (c)(1),
(2) Date: May 27, 2021

(87) PCT Pub. No.: WO2022/032423
PCT Pub. Date: Feb. 17, 2022

(65) Prior Publication Data
US 2022/0310770 A1    Sep. 29, 2022

(51) Int. Cl.
*H10K 59/131* (2023.01)

(52) U.S. Cl.
CPC .................. *H10K 59/1315* (2023.02)

(58) Field of Classification Search
CPC ...................................... H10K 59/1315
USPC ............................................. 257/40
See application file for complete search history.

(56) References Cited

U.S. PATENT DOCUMENTS

| | | |
|---|---|---|
| 2007/0063280 A1 | 3/2007 | Shiau et al. |
| 2011/0279417 A1 | 11/2011 | Kang et al. |
| 2015/0187279 A1* | 7/2015 | Lee ............ H10K 77/111 438/23 |
| 2017/0371376 A1* | 12/2017 | Chung ......... G02F 1/133305 |
| 2019/0295461 A1 | 9/2019 | Zhou et al. |

FOREIGN PATENT DOCUMENTS

| | | |
|---|---|---|
| CN | 107564416 A | 1/2018 |
| CN | 108598142 A | 9/2018 |
| CN | 109727531 A | 5/2019 |
| CN | 111128080 A | 5/2020 |

* cited by examiner

*Primary Examiner* — Xia L Cross
(74) *Attorney, Agent, or Firm* — Lippes Mathias LLP

(57) ABSTRACT

Provided is a display substrate. In the display substrate, a base substrate includes a display region, a bending region and a pad region. A length of the display region in a first direction is greater than a length of the display region in a second direction. Since the pad region, the bending region and the display region are arranged along the second direction, the pad region is arranged on a side where a long boundary line of the display region is located, such that each signal line led into the display region from the pad region has a relatively short length in the display region.

20 Claims, 8 Drawing Sheets

DISPLAY SUBSTRATE AND DISPLAY DEVICE WITH DISPLAY UNIFORMITY

CROSS-REFERENCE TO RELATED APPLICATION

This application is a 371 of PCT Application No. PCT/CN2020/108102, filed on Aug. 10, 2020, the disclosures of which are herein incorporated by reference in their entireties.

TECHNICAL FIELD

The present disclosure relates to the field of display technologies, and in particular, relates to a display substrate and a display device.

BACKGROUND

A display substrate is an essential part of a display device.

In the related art, a base substrate in the display substrate has a display region and a pad region. The display region may be provided with a plurality of pixels arranged in an array, and a signal line configured to drive the pixels to emit light is generally led into the display area via the pad region and thus connected to the plurality of pixels. Moreover, the pad region is generally disposed on a side where a short edge of the display region is located.

SUMMARY

Embodiments of the present disclosure provide a display substrate and a display device.

In one aspect of the embodiments of the present disclosure, a display substrate is provided. The display substrate includes:

a base substrate including a display region, a bending region and a pad region, wherein a length of the display region in a first direction is greater than a length of the display region in a second direction, wherein the first direction is perpendicular to the second direction, and the pad region, the bending region, and the display region are arranged along the second direction;

a plurality of pixels arranged in an array and disposed in the display region; and a plurality of first power line groups and a plurality of first signal lines, wherein each of the first power line groups includes at least two first power lines configured to supply a first direct-current power signal, wherein each of the first power lines and each of the first signal lines extend from the pad region to the display region and are connected to at least one of the pixels, and extending directions of part of line segments for connecting the pixels to each of the first power lines and each of the first signal lines are all parallel to the second direction.

In some embodiments, in the bending region, a distance between two adjacent first power lines in each of the first power line groups is less than or equal to a first distance threshold, and a distance between two adjacent first power line groups is greater than or equal to a second distance threshold, wherein the first distance threshold is less than the second distance threshold.

The display substrate further includes a first bridging portion in the pad region and a second bridging portion in the display region, wherein each of the first power lines includes a first sub-line segment, a second sub-line segment, and a third sub-line segment.

The first sub-line segment is arranged in the pad region, wherein one end of the first sub-line segment is connected to a power supply terminal, and the other end of the first sub-line segment is connected to the first bridging portion.

One end of the second sub-line segment is connected to the first bridging portion, and the other end of the second sub-line segment is connected to the second bridging portion.

One end of the third sub-line segment is connected to the second bridging portion, and the other end of the third sub-line segment is connected to at least one of the pixels.

The first sub-line segment, the second sub-line segment, the third sub-line segment, the first bridging portion, and the second bridging portion are all arranged in the same layer as a source/drain metal layer in the display substrate.

In some embodiments, each of the first power line groups includes a same quantity of first power lines.

In some embodiments, a line width of each of the first power lines is less than or equal to a first line width threshold.

In some embodiments, the plurality of first signal lines include a data signal line configured to supply a data signal, and/or a second power line configured to supply a second direct-current power signal.

In some embodiments, the plurality of first signal lines include a plurality of data signal lines.

Each of the data signal lines includes a data line lead and a data line connected to each other.

The data line lead is arranged in the pad region and the bending region, and the data line is arranged in the display region and connected to at least one of the pixels.

In some embodiments, the data signal line and a first gate metal layer in the display substrate are arranged in the same layer; or the data signal line and a second gate metal layer in the display substrate are arranged in the same layer.

In some embodiments, a line width of each of the second power lines is less than or equal to a second line width threshold.

In some embodiments, the base substrate further includes a first lead region and a second lead region, wherein the first lead region, the display region, and the second lead region are arranged along the first direction, and the display substrate further includes a plurality of second signal lines.

For the plurality of second signal lines, part of the second signal lines extend from the pad region to the first lead region and are connected to at least one of the pixels, and the remaining second signal lines extend from the pad region to the second lead region and are connected to at least one of the pixels.

In some embodiments, a line width of each of the second signal lines is less than or equal to a third line width threshold.

In some embodiments, the second signal lines are configured to supply gate drive signals, and each of the second signal lines includes a gate line lead and a gate line connected to each other.

The gate line lead is arranged in the pad region and the first lead region; or the gate line lead is arranged in the pad region and the second lead region.

The gate line is arranged in the display region, and connected to at least one of the pixels.

In some embodiments, each of the second signal lines includes a first metal layer and a second metal layer, wherein the first metal layer and a first gate metal layer in the display substrate are arranged in the same layer, and the second metal layer and a second gate metal layer in the display substrate are arranged in the same layer.

Alternatively, each of the second signal lines includes a first metal layer, a second metal layer and a third metal layer, wherein the first metal layer and the first gate metal layer in the display substrate are arranged in the same layer, the second metal layer and a second gate metal layer in the display substrate are arranged in the same layer, and the third metal layer and the source/drain metal layer in the display substrate are arranged in the same layer.

In some embodiments, each type of the signal lines includes at least one target signal line, wherein the target signal line is arranged close to an edge of the pad region relative to other signal lines except the target signal line.

A portion, in the pad region, of the target signal line includes a first target sub-line segment and a second target sub-line segment which are sequentially connected, wherein the first target sub-line segment is arranged close to the display region relative to the second target sub-line segment, and an angle between the first target sub-line segment and a boundary line, extending along the first direction, of the display region is less than or equal to 90 degrees.

In some embodiments, the display substrate further includes a plurality of second signal lines, and the first signal line includes a data signal line and a second power line.

The pad region includes a first section and a second section which are symmetrical.

For each type of the signal lines, part of the signal lines are arranged in the first section, and the remaining signal lines are arranged in the second section.

In some embodiments, for each type of the signal lines, a quantity of signal lines in the first partition is equal to a quantity of signal lines in the second partition.

In some embodiments, in each of the sections, a target line group, the second power line, and the second signal line are sequentially arranged along a direction going distally from the other section, wherein the target line group includes the data signal line and the first power line.

In some embodiments, the base substrate further includes a component arrangement region, wherein the component arrangement region and the pad region are arranged on a same side of the display region.

The display substrate further includes a camera component in the component arrangement region.

The pad region includes a first portion and a second portion connected to each other on a side close to the component arrangement region, wherein an extending direction of the first portion is intersected with an extending direction of the second portion.

In some embodiments, the plurality of first signal lines include a data signal line configured to supply a data signal, and/or a second power line configured to supply a second direct-current power signal; wherein each of the data signal lines comprises a data line lead and a data line connected to each other, wherein the data line lead is arranged in the pad region and the bending region, and the data line is arranged in the display region and connected to at least one of the pixels; and the data signal line and the first gate metal layer in the display substrate are arranged in the same layer, or the data signal line and the second gate metal layer in the display substrate are arranged in the same layer;

a line width of each of the second power lines is less than or equal to a second line width threshold, and a line width of each of the second signal lines is less than or equal to a third line width threshold;

each type of the signal lines comprises at least one target signal line, wherein the target signal line is arranged close to an edge of the pad region relative to other signal lines except the target signal line, a portion, in the pad region, of the target signal line comprises a first target sub-line segment and a second target sub-line segment which are sequentially connected, wherein the first target sub-line segment is arranged close to the display region relative to the second target sub-line segment, and an angle between the first target sub-line segment and a boundary line, extending along the first direction, of the display region is less than or equal to 90 degrees;

the pad region comprises a first section and a second section which are symmetrical, wherein for each type of the signal lines, part of the signal lines are arranged in the first section, and the remaining signal lines are arranged in the second section; for each type of the signal lines, a quantity of the signal lines in the first section is equal to a quantity of the signal lines in the second section; and in each of the sections, a target line group, the second power line, and the second signal line are sequentially arranged along a direction going distally from the other section, wherein the target line group comprises the data signal line and the first power line; and the base substrate further comprises a component arrangement region, wherein the component arrangement region and the pad region are arranged on a same side of the display region; the display substrate further comprises a camera component in the component arrangement region; and the pad region comprises a first portion and a second portion connected to each other on a side close to the component arrangement region, wherein an extending direction of the first portion is intersected with an extending direction of the second portion.

In another aspect of the embodiments of the present disclosure, a display device is provided. The display device includes a drive circuit in a pad region, and the display substrate according to the above aspect.

The drive circuit is connected to all types of signal lines in the display substrate, and configured to supply signals to the connected signal lines.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

In order to make the objects, technical solutions, and advantages of the present disclosure clearer, the present disclosure is described in detail hereinafter with reference to the accompanying drawings.

Since the pad region in the related art is arranged on the side where the short edge of the display region is located, each signal line led into the display region from the pad region has a rather long length in the display region, which causes the voltage difference between two ends of each signal line to be relatively great. Consequently, the display device has a poor display effect.

Figure 1:
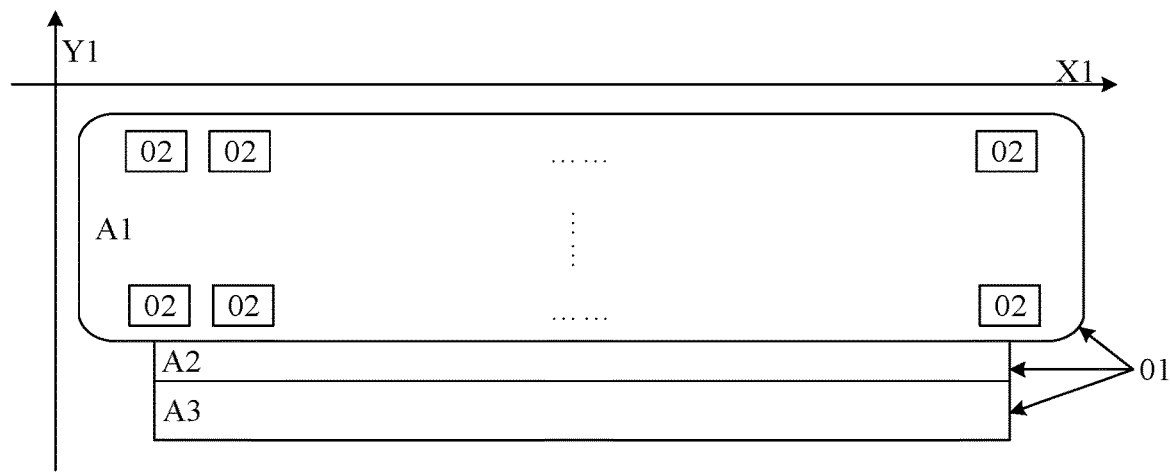
FIG. 1 is a schematic structural diagram of a display substrate according to an embodiment of the present disclosure.

FIG. 1 is a schematic structural diagram of a display substrate according to an embodiment of the present disclosure. As shown in FIG. 1, the display substrate may include a base substrate 01.

The base substrate 01 may include a display region A1, a bending region A2, and a pad region A3. A length of the display region A1 in a first direction X1 may be greater than a length of the display region A1 in a second direction Y1, wherein the first direction X1 may be perpendicular to the second direction Y1. That is, a length of a boundary line, extending along the first direction X1, of the base substrate 01 is greater than a length of a boundary line, extending along the second direction Y1, of the base substrate 01.

For example, with reference to FIG. 1, assuming that the base substrate 01 is in a shape of a rectangle with rounded corners, then the boundary line, extending along the first direction X1, of the display region A1 of the base substrate 01 may be referred to as a long edge, and the boundary line, extending along the second direction Y1, of the display region A1 of the base substrate 01 may be referred to as a short edge. That is, the display region A1 of the base substrate 01 may be enclosed by two long edges and two short edges. The base substrate 01 may be in other shapes (e.g., an oval or polygonal shape). Regardless of the shape, the length of the base substrate 01 in the first direction X1 is greater than the length of the display area A1 in the second direction Y1.

In some embodiments of the present disclosure, the pad region A3, the bending region A2, and the display region A1 may be arranged along the second direction Y1. That is, with reference to FIG. 1, the bending region A2 and the pad region A3 may be arranged on a side where the long edge of the display region A1 is located. For the signal line led into the display region A1 from the pad region A3 via the bending region A2, the extending direction thereof in the display region A1 is generally parallel to an arrangement direction of the display region A1, the bending region A2, and the pad region A3. Thus, by arranging the bending region A2 and the pad region A3 on the side where the long edge of the display area A1 is located may cause the signal line led into the display region A1 from the pad region A3 via the bending region A2 to have a relatively short length in the display region A1. A length of the signal line led into the display region A1 from the pad region A3 via the bending region A2 is generally equivalent to a length of the short edge of the display region A1. Moreover, affected by the loading, a voltage difference between two ends of the signal line is positively correlated with the length of the signal line. That is, the longer the length of the signal line, the greater the voltage difference between two ends of the signal line, and the shorter the length of the signal line, the smaller the voltage difference between two ends of the signal line. Therefore, it is also possible to cause each signal line led into the display region A1 from the pad region A3 to have a relatively small voltage difference between two ends of the signal line.

Figure 2:
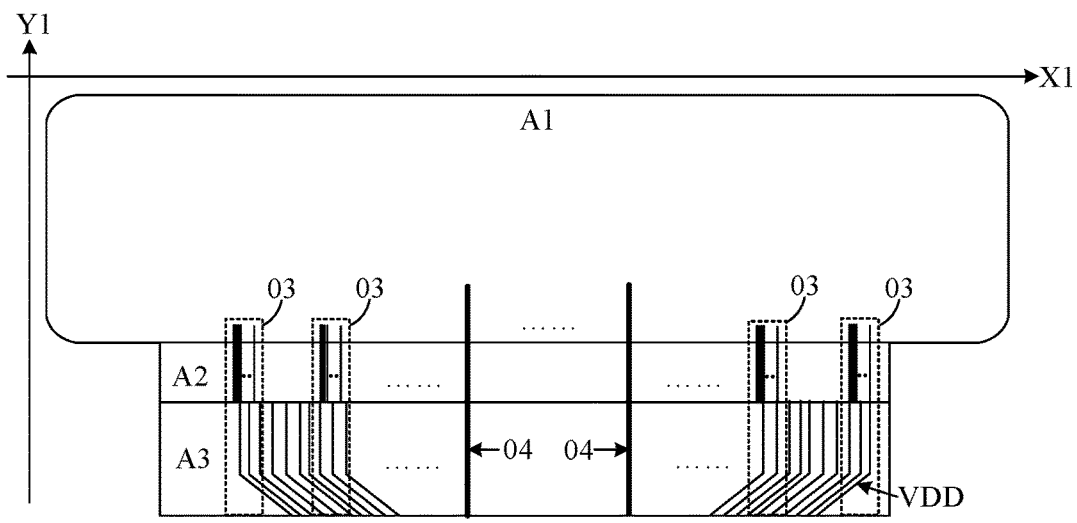
FIG. 2 is a schematic structural diagram of another display substrate according to an embodiment of the present disclosure.

FIG. 2 is a schematic structural diagram of another display substrate according to an embodiment of the present disclosure. With reference to FIG. 1 and FIG. 2, the display substrate may further include: a plurality of pixels 02 arranged in an array and disposed in the display region A1, and a plurality of first power line groups 03 and a plurality of first signal lines 04. Each of the first power line groups 03 herein may include at least two first power lines VDD configured to supply a first direct-current power signal. Each of the first power lines VDD and each of the first signal lines 04 may both extend from the pad region A3 to the display region A1 via the bending region A2 and be connected to at least one of the pixels 02. In addition, extending directions of part of line segments for connecting the pixels to each of the first power lines VDD and each of the first signal lines 04 may all be parallel to the second direction Y1.

With further reference to FIG. 1, compared with the related art where the pad region A3 is arranged on the side where the short edge of the display region A1 is located, that arranging the pad region A3 on the side where the long edge of the display region A1 is located may reduce the length of each of the signal lines 04 led into the display region A1 from the pad region A3 and thereby reduce the voltage difference between two ends of each signal line. Moreover, the smaller the voltage difference between the two ends of each signal line, the better the uniformity of the display effect of the pixels connected at one end of each of the signal lines 04. Thus, the uniformity of the display effect of the display substrate can also be improved.

It should be noted that the base substrate 01 according to the embodiments of the present disclosure may be a base substrate 01 having a special size. The special size may indicate that the length of the display region A1 of the base substrate 01 in the first direction X1 is much greater than the length of the display region A1 in the second direction Y1. For example, a ratio of the length of the display area A1 in the first direction X1 of the base substrate 01 to the length of the display area A1 in the second direction Y1 satisfies a ratio threshold. In some embodiments, the ratio threshold is about 3%. For example, taking the display substrate shown in FIG. 1 as an example, in the display substrate, the ratio of the long edge to the short edge of the display region A1 of the base substrate 01 may satisfy 27.5:9.

In summary, the embodiments of the present disclosure provide a display substrate. In the display substrate, the base substrate includes a display region, a bending region and a pad region. The length of the display region in the first direction is greater than the length of the display region in the second direction. Since the pad region, the bending region and the display region are arranged along the second direction, the pad region is arranged on a side where a long boundary line of the display region is located, such that each signal line led into the display region from the pad region has a relatively short length in the display region. Accordingly, a voltage difference between the two ends of each signal line led into the display region from the pad region is relatively small, and the display device adopting the display substrate can thereby exert a good display effect.

In some embodiments, with reference to FIG. 2, for the display substrate according to the embodiments of the present disclosure, in the bending region A2, a distance between two adjacent first power lines VDD in each of the first power line groups 03 may be equal to a first distance threshold, and a distance between two adjacent first power line groups 03 may be greater than or equal to a second distance threshold. The first distance threshold may be less than the second distance threshold. For example, the first distance threshold is generally about 0.001 μm, and the second distance threshold is generally about 5000 μm. That is, the plurality of first power lines VDD may be wired in the bending region A2 in groups (i.e., in blocks).

By wiring in blocks, a first power line group 03 may have an enlarged cross-sectional area relative to one first power line VDD, such that a resistance on each of the first power lines VDD in each of the first power line groups 03 may be reduced. Further, signal lines can be easily arranged in the bending region A2 having a limited space (such as height and width), which facilitates the wiring.

Figure 3:
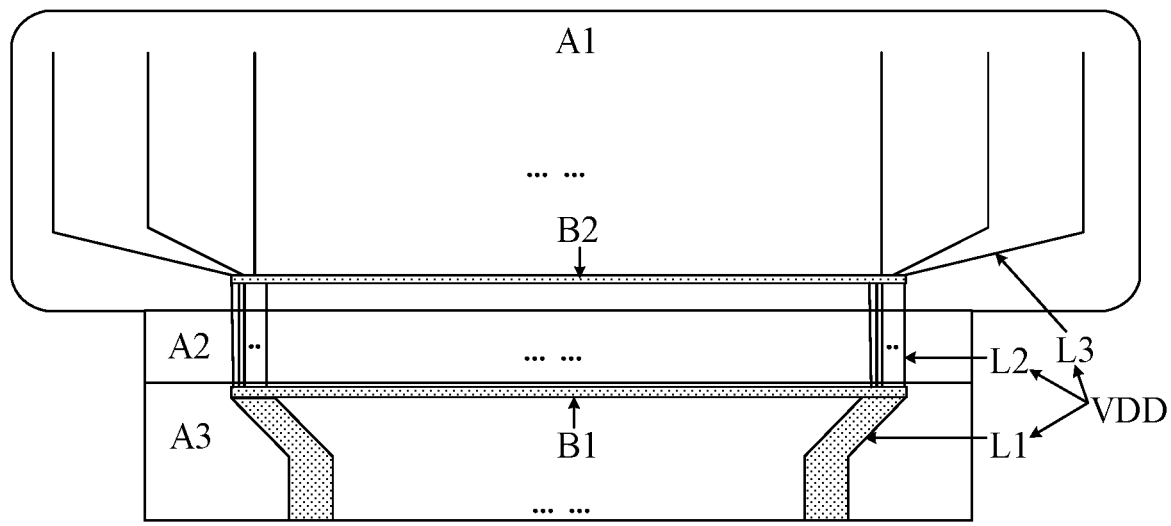
FIG. 3 is a schematic structural diagram of yet another display substrate according to an embodiment of the present disclosure.

In some embodiments, FIG. 3 is a schematic structural diagram of yet another display substrate according to an embodiment of the present disclosure. As shown in FIG. 3, the display substrate may further include a first bridging portion B1 and a second bridging portion B2. The first bridging portion B1 herein may be arranged in the pad area A3, and the second bridging portion B2 may be arranged in the display area A1.

Each of the first power lines VDD may include a first sub-line segment L1 (FIG. 3 only schematically shows a plurality of first power lines in the pad region A3 with a large piece of metal block, and the first sub-line segment L1 is a sub-line segment belonging to the metal block), a second sub-line segment L2, and a third sub-line segment L3. The first sub-line segment L1 herein may be arranged in the pad region A3. Moreover, one end of the first sub-line segment L1 may be connected to a power supply terminal, and the other end of the first sub-line segment L1 may be connected to the first bridging portion B1; one end of the second sub-line segment L2 may be connected to the first bridging portion B1, and the other end of the second sub-line segment L2 may be connected to the second bridging portion B2; and one end of the third sub-line segment L3 may be connected to the second bridging portion B2, and the other end of the third sub-line segment L3 may be arranged in the display area A1 and connected to at least one of the pixels 02 (not shown).

With reference to FIG. 2, the plurality of first power lines VDD are led out from the pad region A3 to the display region A1 via the bending area A2 in a fashion as follows: the plurality of first power lines VDD included in the plurality of first power line groups 03 are led out from the pad region A3 to the display region A1 and connected together at the first bridging portion B1 in advance. That is, the first bridging portion B1 is a layer of metal blocks formed by connecting each of the first power lines VDD. Afterwards, the plurality of first power lines VDD that are connected together are split and further led out to the display region A1, and the plurality of first power lines VDD as split are connected together again at the second bridging portion B2. That is, the second bridging portion B2 is another layer of metal blocks formed by connecting each of the first power lines VDD. In addition, the plurality of first power line groups 03 between the first bridging portion B1 and the second bridging portion B2 may be such configured that the distance between two adjacent first power lines VDD in each of the first power line groups 03 is less than or equal to the first distance threshold, and the distance between two adjacent first power line groups 03 is greater than or equal to the second distance threshold. Finally, the plurality of first power lines VDD that are connected together again are split again, and each of the first power lines VDD is connected to at least one of the pixels 02 respectively. For example, each of the first power lines VDD may be connected to a column of pixels. Accordingly, a quantity of the first power lines VDD included in the display substrate may be equal to a quantity of columns of the included pixels.

It should be noted that in this wiring mode, with reference to FIG. 3, the plurality of first power line groups 03 arranged both in the pad region A3 close to the bending region A2 and in the display region A1 close to the bending region A2 may both satisfy that the distance between two adjacent first power lines VDD in each of the first power line groups 03 is less than or equal to the first distance threshold, and the distance between two adjacent first power line groups 03 is greater than or equal to the second distance threshold. In addition, the pad region A3 is further provided with a drive circuit which may supply a power supply terminal connected with one end of the first sub-line segment L1. That is, one end of the first sub-line segment L1 may be connected to the drive circuit.

In some embodiments, the first sub-line segment L1, the second sub-line segment L2, the third sub-line segment L3, the first bridging portion B1 and the second bridging portion B2 may all be arranged in the same layer as the source/drain (SD) metal layer in the display substrate. The SD layer is an essential part for forming the pixels. In this way, the manufacturing process can be simplified and the manufacturing cost can be saved.

In some embodiments, each of the first power line groups 03 may include a same quantity of the first power lines VDD. That is, the first power lines VDD may be uniformly arranged in blocks, which not only can further facilitate the wiring but also cause the resistance of each of the first power lines VDD to be consistent. Correspondingly, the difference in potentials of the first power signals supplied by the plurality of first power lines VDD to the plurality of pixels is relatively small, which further ensures the display uniformity of the display device.

Figure 4:
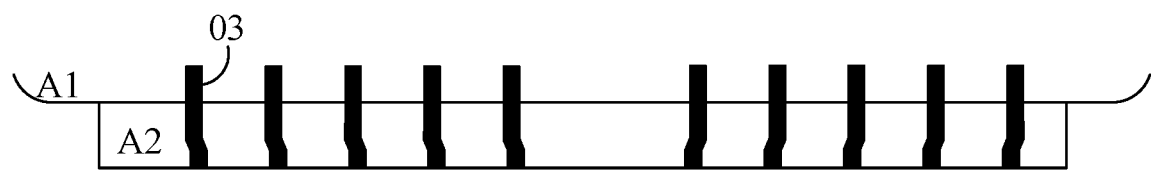
FIG. 4 is a schematic structural diagram of still yet another display substrate according to an embodiment of the present disclosure.

For example, with reference to FIG. 4, assuming that a total of 4000 first power lines VDD shall be provided, then the 4000 first power lines VDD may be divided into ten first power line groups 03, and each of the first power line groups 03 is configured to include 400 first power lines VDD. FIG. 4 does not show the specific quantity of the first lines VDD and merely shows respective first power line groups 03 extending from the bending area A2 to the display area A1.

Figure 5:
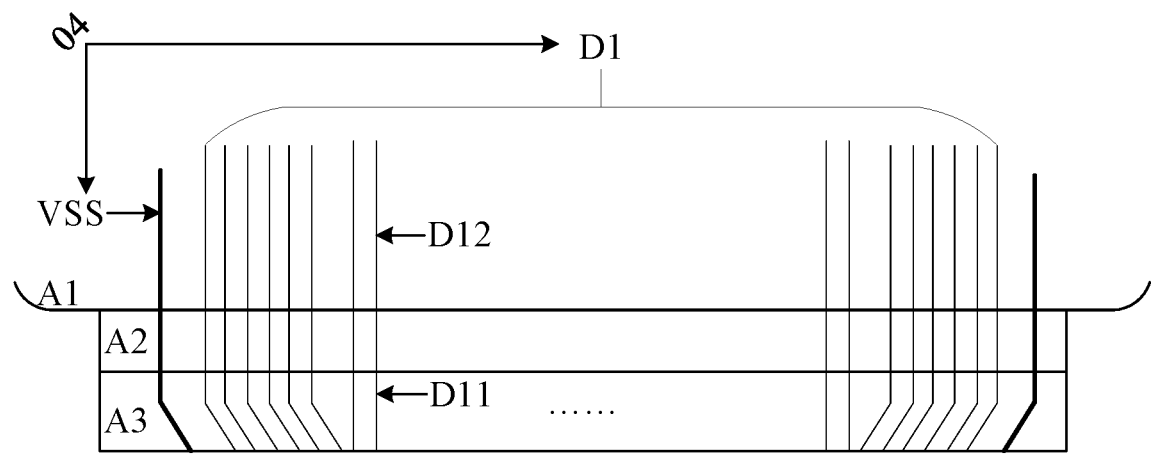
FIG. 5 is a schematic structural diagram of still yet another display substrate according to an embodiment of the present disclosure.

FIG. 5 is a schematic structural diagram of still yet another display substrate according to an embodiment of the present disclosure. As shown in FIG. 5, the plurality of first signal lines 04 include a data signal line D1 configured to supply a data signal, and/or a second power line VSS configured to supply a second-direct current power signal. That is, the plurality of first signal lines 04 may include a plurality of data signal lines D1, or include a plurality of second power lines VSS, or include a plurality of data signal lines D1 and a plurality of second power lines VSS.

Further with reference to FIG. 5, each of the data signal lines D1 may include a data line lead D11 and a data line D12 connected to each other. The data line lead D11 may be disposed in the bending region A2 and the pad region A3, and the data line D12 may be disposed in the display area A1 and connected to at least one of the pixels 02 in the display region A1 (not shown). That is, a line segment part, in the bending region A2 and the pad region A3, of the data signal lines D1 may be referred to as the data line lead D11, and a line segment part, in the display region A1, of the data signal lines D1 may be referred to as the data line D12.

Figure 6:
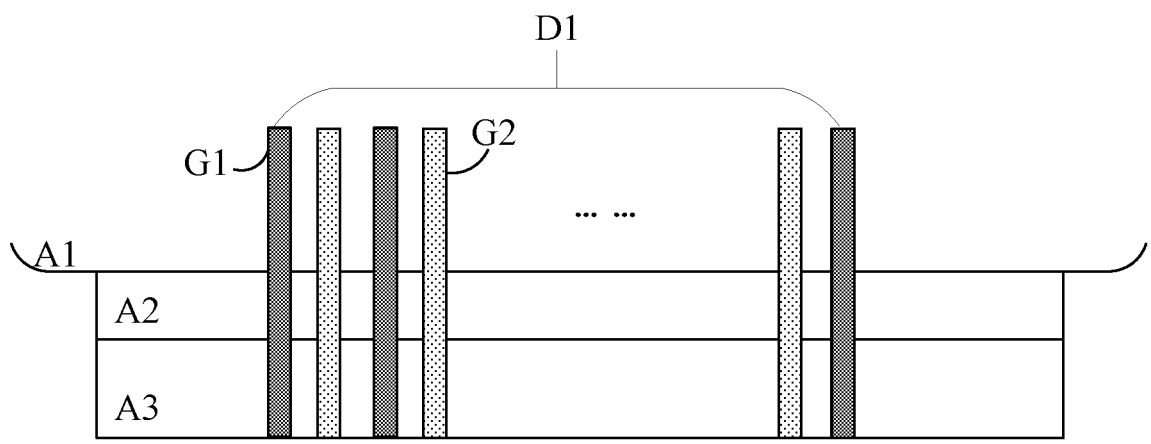
FIG. 6 is a schematic structural diagram of still yet another display substrate according to an embodiment of the present disclosure.
Figure 7:
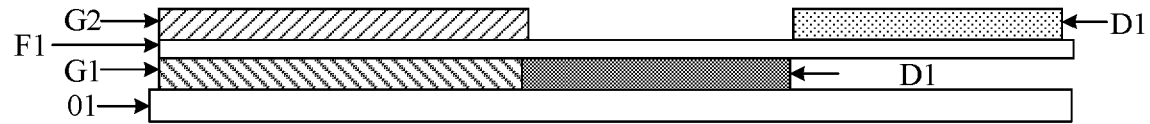
FIG. 7 is a schematic structural diagram of still yet another display substrate according to an embodiment of the present disclosure.

In some embodiments, FIG. 6 is a schematic structural diagram of still yet another display substrate according to an embodiment of the present disclosure, and FIG. 7 is a schematic structural diagram of still yet another display substrate according to an embodiment of the present disclosure. With reference to FIG. 6 and FIG. 7, the data signal lines D1 and a first gate metal layer G1 in the display substrate may be arranged in the same layer. Alternatively, the data signal lines D1 and a second gate metal layer G2 in the display substrate may be arranged in the same layer. For example, with reference to FIG. 6 and FIG. 7, for two adjacent data signal lines D1, one data signal line D1 and the first gate metal layer G1 may be arranged in the same layer, and the other data signal line D1 and the second gate metal layer G2 may be arranged in the same layer. Since the gate metal layer is also an essential component for forming the pixels 02, the manufacturing process can be further simplified and the manufacturing cost can be saved.

An insulating layer is generally arranged between the gate metal layer (such as G1 and G2) and the SD layer. Since the first power lines VDD and the SD layer are arranged in the same layer, the data signal lines D1 may be arranged under the first power lines VDD, so as to arrange all the required data signal lines D1 and the first power lines VDD in the bending region A2 and the pad region A3 which have a limited size. That is, an orthographic projection of the first power lines VDD on the base substrate 01 is configured to cover an orthographic projection of the data signal lines D1 on the base substrate 01.

Figure 8:
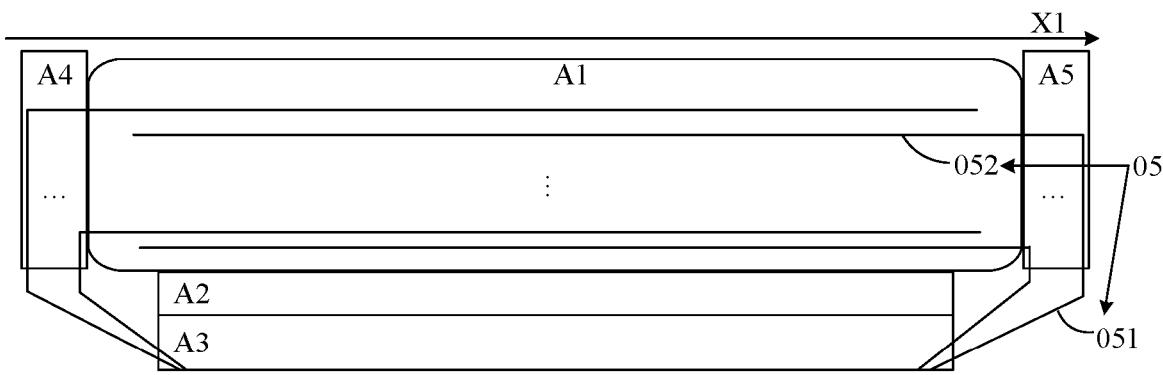
FIG. 8 is a schematic structural diagram of still yet another display substrate according to an embodiment of the present disclosure.

FIG. 8 is a schematic structural diagram of still yet another display substrate according to an embodiment of the present disclosure. As shown in FIG. 8, the base substrate 01 may further include a first lead region A4 and a second lead region A5. The first lead region A4, the display region A1, and the second lead region A5 may be arranged along the first direction X1.

In embodiments of the present disclosure, the display substrate further includes a plurality of second signal lines 05. For the plurality of second signal lines 05, part of the second signal lines 05 may extend from the pad region A3 to the first lead region A4 and be connected to at least one of the pixels 02; and the remaining second signal lines 05 may extend from the pad region A3 to the second lead region A5 and be connected to at least one of the pixels 02.

In some embodiments, the second signal lines 05 may be configured to supply gate drive signals. Accordingly, as shown in FIG. 8, each of the second signal lines 05 may include a gate line lead 051 and a gate line 052 connected to each other.

The gate line lead 051 herein may be arranged in the pad region A3 and the first lead region A4, or the gate line lead 051 may be arranged in the pad region A3 and the second lead region A5. The gate line 052 may be arranged in the display region A1 and connected to at least one of the pixels 02 (not shown). In some embodiments, the gate line lead 051 may supply a gate drive signal to the gate line 052 first, and then the gate line 052 may supply the received gate drive signal to the connected pixels 02. Thus, the gate line lead 051 may also be referred to as a gate drive on array (GOA) signal line. The GOA refers to integrating the gate drive circuit on the substrate by an array substrate row driving technology.

In some embodiments, under restriction by the size of the bending region A2 and the pad region A3, a line width of each of the first power lines VDD is less than or equal to a first line width threshold to ensure the required signal lines can be arranged. A line width of each of the second power lines VSS may be less than or equal to a second line width threshold, and a line width of each of the second signal lines 05 may be less than or equal to a third line width threshold. For example, the first line width threshold may be about 600 μm, the second line width threshold may be about 500 μm, and the third line width threshold may be about 88 μm.

Figure 9:
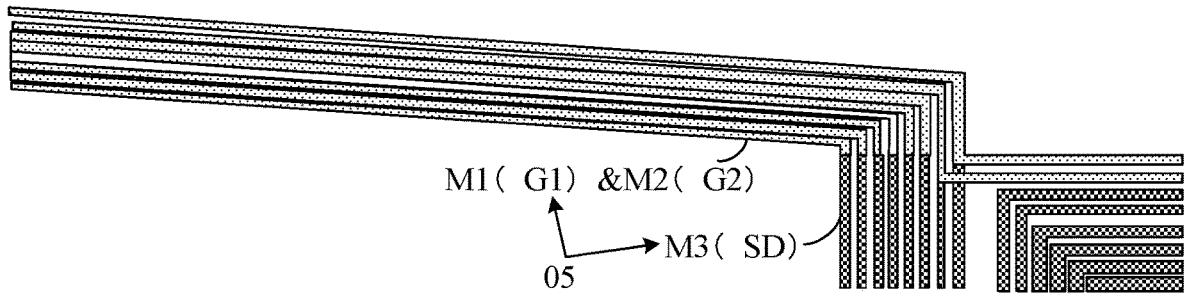
FIG. 9 is a schematic structural diagram of still yet another display substrate according to an embodiment of the present disclosure.
Figure 10:
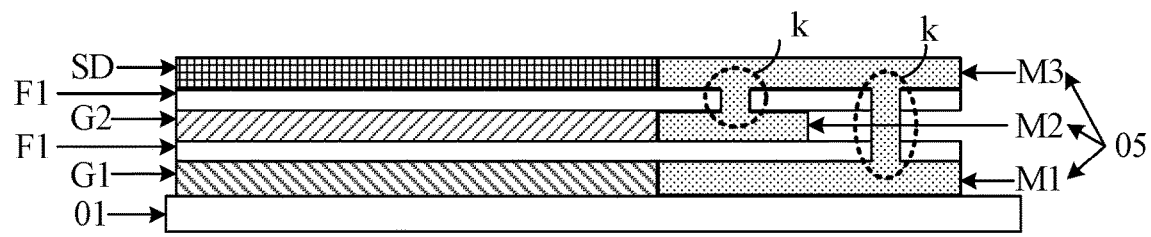
FIG. 10 is a schematic structural diagram of still yet another display substrate according to an embodiment of the present disclosure.

In some embodiments, each of the second signal lines may include a first metal layer and a second metal layer. The first metal layer and the first gate metal layer in the display substrate may be arranged in the same layer, and the second metal layer and the second gate metal layer in the display substrate may be arranged in the same layer. That is, the second signal lines 05 may be composed of the first gate metal layer G1 and the second gate metal layer G2 in parallel. Alternatively, as shown in FIG. 9 and FIG. 10, each of the second signal lines 05 may include a first metal layer M1, a second metal layer M2, and a third metal layer M3. The first metal layer M1 and the first gate metal layer G1 in the display substrate may be arranged in the same layer, the second metal layer M2 and the second gate metal layer G2 in the display substrate may be arranged in the same layer, and the third metal layer M3 and the SD metal layer in the display substrate may be arranged in the same layer. That is, the second signal lines 05 may be composed of the first gate metal layer G1, the second gate metal layer G2 and the SD metal layer in parallel. Moreover, with reference to FIG. 10, an insulating layer F1 may be arranged between two adjacent metal layers. Furthermore, in order to ensure the reliable connection between the first metal layer M1, the second metal layer M2 and the third metal layer M3, each insulating layer F1 may be provided with a via hole k penetrating the insulating layer F1, such that the first metal layer M1 and the second metal layer M2 may both be electrically connected to the third metal layer M3 through the via hole k. By forming the second signal lines 05 with different metal layers arranged in parallel, each of the second signal lines 05 may be composed of a plurality of metal traces having a rather short length. The shorter the length of the signal lines, the smaller the resistance of the signal lines. Thus, the resistance of each of the second signal lines 05 can be reduced and a good display effect can be exerted.

It should be noted that regardless of the data line lead D11 or the gate line lead 051, these leads are both arranged in the non-display area and thus are both referred to as fanout traces. With reference to FIG. 1, FIG. 5, and FIG. 8, since the pad area A3 is arranged on the side where the long edge of the display region A1 is located, the position of the pixels 02 may be correspondingly rotated with respect to the related art to facilitate the connection from the data line D12 and the gate line 052 to the pixels 02 in the display region A1. After the rotation, the extending direction of the gate line 052 connected to the pixels 02 is parallel to the first direction X1, and the extending direction of the data line D12 connected to the pixels 02 is parallel to the second direction Y1. That is, the plurality of pixels 02 arranged along the first direction X1 are referred to as a row of pixels, and the plurality of pixels 02 arranged along the second direction Y1 are referred to as a column of pixels.

In some embodiments, if the display substrate is an organic light-emitting diode (OLED) substrate, each of the pixels 02 may include a pixel circuit and a light-emitting element. The pixel circuit may be connected to one of the first power lines VDD, a gate line 052, a data line D12, and one end (e.g., the anode) of the light-emitting element respectively. The other end (e.g., the cathode) of the light-emitting element may be connected to the second power lines VSS. The pixel circuit may output a drive signal to the light-emitting element in response to the gate drive signal supplied by the gate line 052, the data signal supplied by the data line D12, and the first power signal supplied by the first power lines VDD. The light-emitting element may emit light under an action of the voltage difference between the drive signal as received and the second power signal supplied by the second power lines VSS. That is, the potential of the first power signal may be an effective potential relative to the potential of the second power signal.

Figure 11:
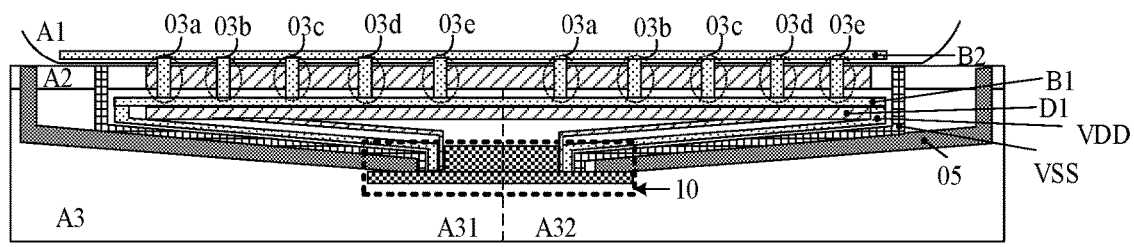
FIG. 11 is a schematic structural diagram of still yet another display substrate according to an embodiment of the present disclosure.

In some embodiments, FIG. 11 is a schematic structural diagram of still yet another display substrate according to an embodiment of the present disclosure. With further reference to FIG. 1 and FIG. 11, the pad region A3 is arranged on the side where the long edge of the display region A1 is located. Thus, the pad region A3 may include a first section A31 and a second section A32 which are symmetrical to ensure reliable driving of the pixels on left and right sides of the display region A1 along the first direction X1. In addition, the layout and wiring of the bending region A2 and the pad region A3 are both the same.

For the first power lines VDD of the display region A1 led into the display region A1 from the pad region A3 via the bending region A2, the first signal lines 04 (including the data signal lines D1 and the second power lines VSS), and the second signal lines 05 led from the pad region A3 to the lead region, in each type of the signal lines, part of the signal lines may be arranged in the first section A31, and the remaining signal lines may be arranged in the second section A32. Moreover, with reference to FIG. 11 and FIG. 12, in the display substrate, the quantity of the first power line groups included in and led into the display region A1 from each of the sections of the pad region A3 via the bending region A2 is five, and the first power line groups are respectively identified as 03*a*, 03*b*, 03*c*, 03*d*, and 03*e*. FIG. 11 further shows a drive circuit 10 arranged in the pad area A3. All types of the signal lines are connected to the drive circuit 10 and receive signals supplied by the drive circuit 10. That is, signals supplied by all types of the signal lines to the pixels may all be derived from the drive circuit 10.

Figure 12:
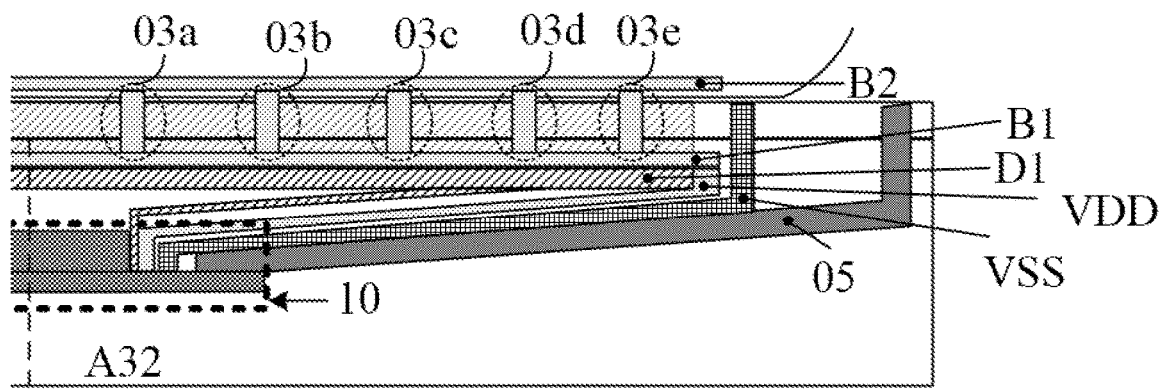
FIG. 12 is a schematic structural diagram of still yet another display substrate according to an embodiment of the present disclosure.
Figure 13:
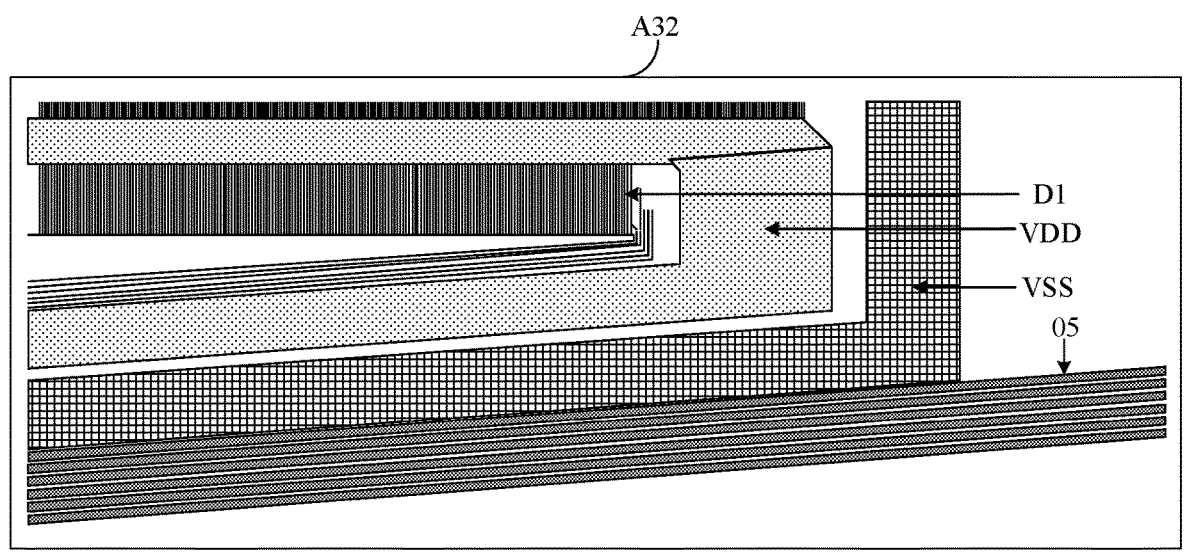
FIG. 13 is a schematic structural diagram of still yet another display substrate according to an embodiment of the present disclosure.
Figure 14:
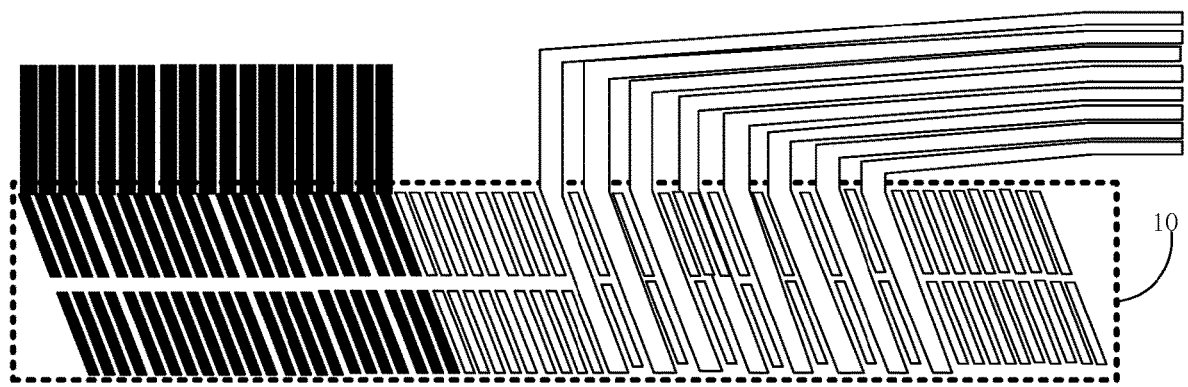
FIG. 14 is a schematic structural diagram of still yet another display substrate according to an embodiment of the present disclosure.
Figure 15:
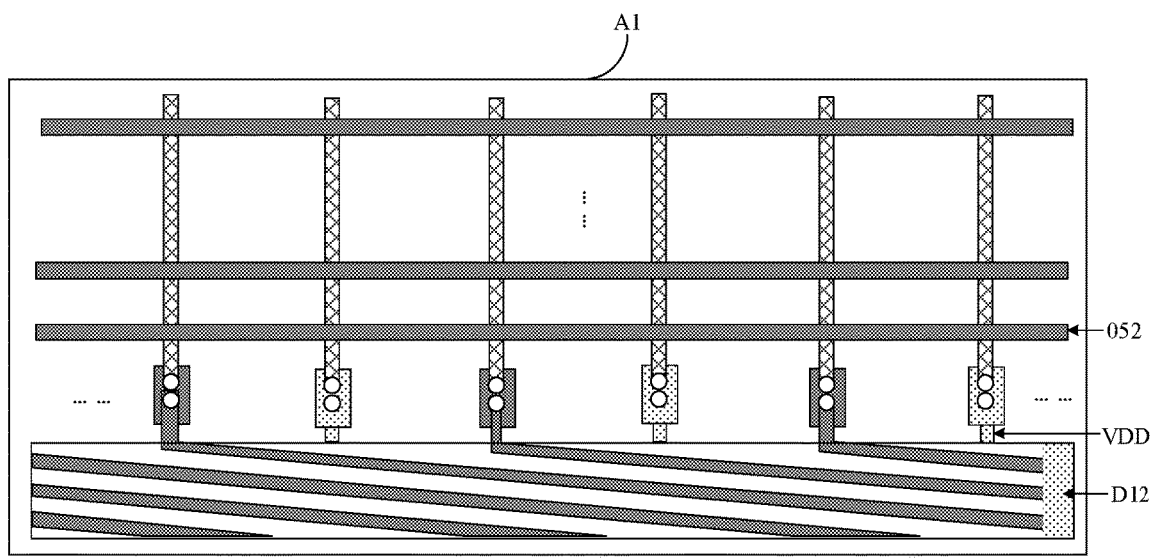
FIG. 15 is a schematic structural diagram of still yet another display substrate according to an embodiment of the present disclosure.

Taking the second section A32 as an example, FIG. 12 is a schematic diagram of an overall structure of the second section A32. FIG. 13 is a schematic diagram of other structures except for the drive circuit 10 in the second section A32. Further, with reference to FIG. 12 and FIG. 13, the data signal lines D1 may be arranged under the first power lines VDD. Moreover, prior to being connected to the pixels 02, the plurality of first power lines VDD led from the pad region A3 may all be connected to the first bridging portion B1 first. Afterwards, the plurality of first power lines VDD are split for entering the bending area A2, and all connected to the second bridging portion B2 as soon as entering the display area A1. Finally, the plurality of first power lines VDD are split again for entering the display area to thereby connect to the pixels 02. FIG. 14 shows a schematic diagram of an internal structure of the drive circuit 10. It should be noted that, with reference to FIG. 14, the line width of the plurality of signal lines (e.g., fanout traces) led from the drive circuit 10 in a vacant region of the pad region A3 (that is, an area where no structure is provided) may be greater than the line width threshold. That is, the signal lines in the vacant region may be thickened to achieve an effect of reducing the resistance of the signal lines. FIG. 15 is a schematic diagram of the first power lines VDD, the data line D12 included in the data signal lines D1, and the gate line 052 included in the second signal lines 05 in the display region A1. With reference to FIG. 15, the plurality of first power lines VDD may be connected together first after entering the display region A1. That is, the first power lines VDD are connected into one piece first, and then split and connected to the pixels.

In some embodiments, for each type of signal lines, a quantity of signal lines in the first section A31 is equal to a quantity of signal lines in the second section A32, in order to facilitate the wiring and ensure the uniformity of the display effect of the pixels 02 at various positions in the display region A1.

That is, with reference to FIG. 11, the display substrate as shown includes 10 first power line groups 03, and each of the first power line groups 03 may include 400 first power lines VDD. The display substrate further includes two second power lines VSS, a plurality of data signal lines D1, and a plurality of second signal lines 05. For the 10 first power line groups 03 herein, five first power line groups 03 may be led into the display region A1 from the first section A31, and the other five first power line groups 03 may be led into the display region A1 from the second section A32. For two second power lines VSS, one second power line VSS may be led into the display region A1 from the first section A31, and the other second power line VSS may be led into the display area A1 from the second section A32. For the plurality of data signal lines D1, half of the data signal lines D1 may be led into the display region A1 from the first section A31, and the other half of the data signal lines D1 may be led into the display region A1 from the second section A32. For the plurality of second signal lines 05, half of the second signal lines 05 may be led into the display region A1 from the first section A31, and the other half of the second signal lines 05 may be led into the display region A1 from the second section A32.

Further with reference to FIG. 11, a target line group, the second power line VSS, and the second signal line 05 in each of the sections may be sequentially arranged along a direction going distally from the other section. The target line group herein may include the data signal lines D1 and the first power lines VDD. That is, the second signal lines 05, the second power lines VSS, and the target line group may be sequentially arranged from an outermost side of the pad region A3 to the most central position of the pad region A3.

Figure 16:
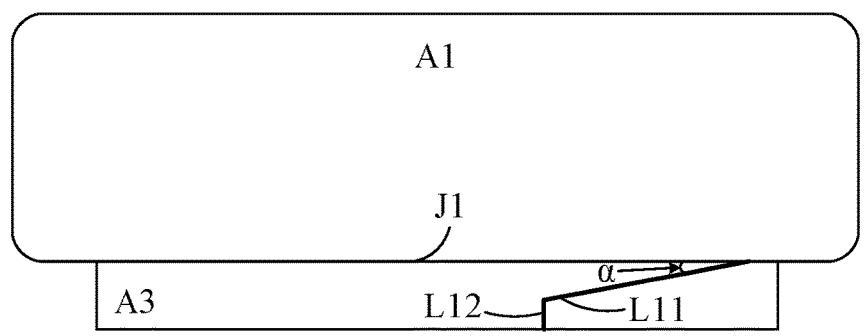
FIG. 16 is a schematic structural diagram of still yet another display substrate according to an embodiment of the present disclosure.

In some embodiments, with reference to FIG. 11 and FIG. 16, under restriction by the size of the pad region A3, each type of the signal lines in each of the sections includes at least one target signal line, and the target signal lines are arranged close to an edge of the pad region A3 relative to other signal lines except the target signal line, in order to ensure that all required types of signal lines can be arranged in the pad region A3. FIG. 16 does not show the portion of the bending region A2.

A portion, in the pad region A3, of the target signal line includes a first target sub-line segment L11 and a second target sub-line segment L22 that are sequentially connected. The first target sub-line segment L11 is arranged close to the display region A1 relative to the second target sub-line segment L12, and an angle α between the first target sub-line segment L11 and a boundary line J1, extending along the first direction X1, of the display region A1 may be less than or equal to 90 degrees. Generally, the angle between the first target sub-line segment L11 and the boundary line J1, extending along the first direction X1, of the display area A1 may be configured as about tens of degrees. That is, for all types of signal lines, the signal lines close to the edge of the pad area A3 extend diagonally from the pad region A3 to the display region A1.

Figure 17:
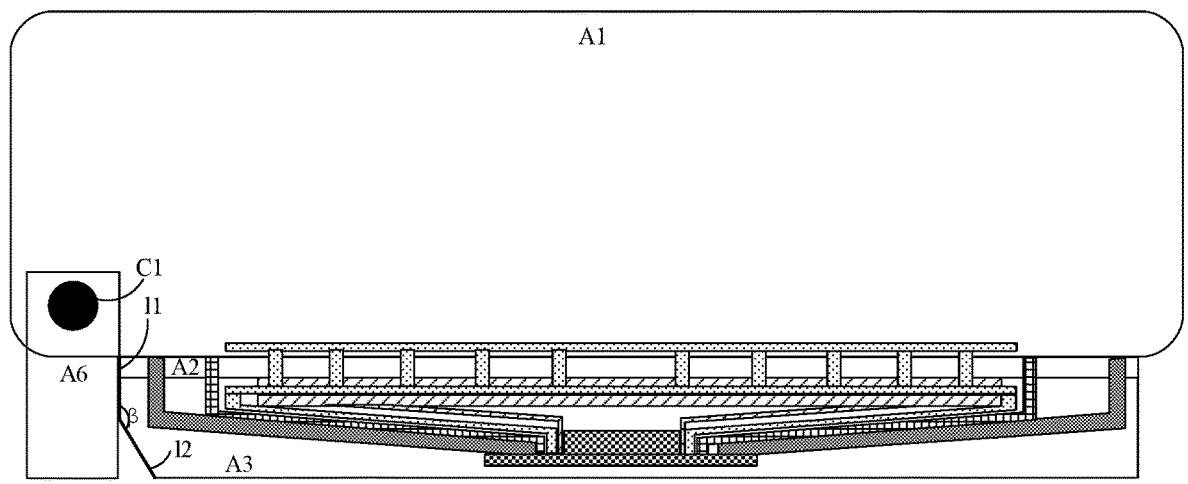
FIG. 17 is a schematic structural diagram of still yet another display substrate according to an embodiment of the present disclosure.

FIG. 17 is a schematic structural diagram of still yet another display substrate according to an embodiment of the present disclosure. As shown in FIG. 17, the base substrate may further include a component arrangement region A6. The component arrangement region A6 and the pad region A3 may be arranged on the same side of the display area A1. The display substrate further includes a camera component C1 in the component arrangement region A6.

Correspondingly, in order to avoid the arrangement of the camera component C1, with reference to FIG. 17, the pad region A3 has a first portion 11 and a second portion 12 connected to each other on a side close to the component arrangement region A6, and an extending direction of the first portion 11 is intersected with and namely not in parallel to the extending direction of the second portion 12. In this way, a space may be saved for the component arrangement region A6 to thereby facilitate the arrangement of hardware structures such as the camera component C1. For example, with reference to FIG. 17, an angle β as shown may be formed between the first portion 11 and the second portion 12 on the side of the pad region A3 close to the component arrangement region A6, and the angle herein may also be referred to as a cutting angle of the boundary line of the pad region A3.

In summary, the embodiments of the present disclosure provide a display substrate. In the display substrate, the base substrate has a display region, a bending region and a pad region. The length of the display region in the first direction is greater than the length of the display region in the second direction. Since the pad region, the bending region and the display region are arranged along the second direction, the pad region is arranged on a side where a long boundary line of the display region is located, such that each of the signal lines led into the display region from the pad region has a relatively short length in the display region. Accordingly, a voltage difference between two ends of each of the signal lines led into the display region from the pad region is relatively small, and the display device adopting the display substrate can thereby exert a good display effect.

Figure 18:
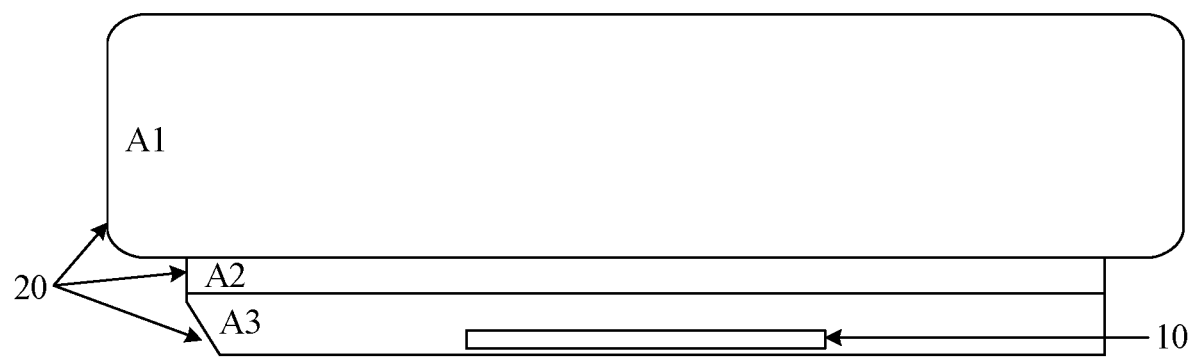
FIG. 18 is a schematic structural diagram of a display device according to an embodiment of the present disclosure.

FIG. 18 is a schematic structural diagram of a display device according to an embodiment of the present disclosure. As shown in FIG. 18, the display device may include a drive circuit 10 in the pad region A3, and a display substrate 20 as shown in any one of FIGS. 1 to 17. The drive circuit 10 herein may be connected to all types of signal lines included in the display substrate 20, and configured to supply signals to the connected signal lines.

For example, the drive circuit 10 may supply a data signal to the data signal lines D1, supply a gate drive signal to the second signal lines 05, supply a first power signal to the first power lines VDD, and supply a second power signal to the second power lines VSS.

In some embodiments, the display device may be any product or component having a display function, such as an OLED display device, electronic paper, a mobile phone, a tablet computer, a TV set, a display, a notebook computer, a navigator, or the like.

It should be understood that "a plurality of" mentioned in the present disclosure means two or more in number. The term "and/or" describes the association relationship between the associated objects and indicates that there may be three relationships; for example, A and/or B may indicate three cases where only A exists, A and B exist at the same time, and only B exists.

It should be further understood that an expression "C is about m" as mentioned in the present disclosure means that the difference value between C and m is within an allowable error range of the process parameter. For example, assuming that the allowable error range of the process parameter is n, then "C is about m" may mean that C is greater than or equal to m-n and less than or equal to m+n.

A person skilled in the art may clearly understand that for the specific working process of the display substrate and display device described above, reference may be made to the corresponding process in the method embodiments, and details are not described herein for the convenience and brevity of the description.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display substrate, comprising:
   a base substrate comprising a display region, a bending region and a pad region, wherein a length of the display region in a first direction is greater than a length of the display region in a second direction, wherein the first direction is perpendicular to the second direction, and the pad region, the bending region, and the display region are arranged along the second direction;
   a plurality of pixels arranged in an array and disposed in the display region;
   a first bridging portion in the pad region and a second bridging portion in the display region; and
   a plurality of first power line groups and a plurality of first signal lines, wherein each of the first power line groups comprises at least two first power lines configured to supply a first direct-current power signal, wherein each of the first power lines and each of the first signal lines extend from the pad region to the display region and are connected to at least one of the pixels, and extending directions of part of line segments for connecting the pixels to each of the first power lines and each of the first signal lines are all parallel to the second direction; each of the first power lines comprises a first sub-line segment, a second sub-line segment, and a third sub-line segment; wherein the first sub-line segment is arranged in the pad region, wherein one end of the first sub-line segment is connected to a power supply terminal, and the other end of the first sub-line segment is connected to the first bridging portion; one end of the second sub- line segment is connected to the first bridging portion, and the other end of the second sub-line segment is connected to the second bridging portion; and one end of the third sub-line segment is connected to the second bridging portion, and the other end of the third sub-line segment is connected to at least one of the pixels;

wherein the first sub-line segment, the second sub-line segment, the third sub-line segment. the first bridging portion, and the second bridging portion are all arranged in the same layer as a source/drain metal layer in the display substrate.

2. The display substrate according to claim 1, wherein in the bending region, a distance between two adjacent first power lines in each of the first power line groups is less than or equal to a first distance threshold, and a distance between two adjacent first power line groups is greater than or equal to a second distance threshold, wherein the first distance threshold is less than the second distance threshold.

3. The display substrate according to claim 1, wherein each of the first power line groups comprises a same quantity of first power lines.

4. The display substrate according to claim 1, wherein a line width of each of the first power lines is less than or equal to a first line width threshold.

5. The display substrate according to claim 1, wherein the plurality of first signal lines comprise a data signal line configured to supply a data signal, and/or a second power line configured to supply a second direct-current power signal.

6. The display substrate according to claim 5, wherein the plurality of first signal lines comprise a plurality of data signal lines;
wherein each of the data signal lines comprises a data line lead and a data line which are connected to each other;
wherein the data line lead is arranged in the pad region and the bending region, and the data line is arranged in the display region and connected to at least one of the pixels.

7. The display substrate according to claim 5, wherein the data signal line and a first gate metal layer in the display substrate are arranged in the same layer; or the data signal line and a second gate metal layer in the display substrate are arranged in the same layer.

8. The display substrate according to claim 5, wherein a line width of each of the second power lines is less than or equal to a second line width threshold.

9. The display substrate according to claim 1, wherein the base substrate further comprises a first lead region and a second lead region, wherein the first lead region, the display region, and the second lead region are arranged along the first direction; the display substrate further comprises a plurality of second signal lines;
wherein for the plurality of second signal lines, part of the second signal lines extend from the pad region to the first lead region and are connected to at least one of the pixels, and the remaining second signal lines extend from the pad region to the second lead region and are connected to at least one of the pixels.

10. The display substrate according to claim 9, wherein a line width of each of the second signal lines is less than or equal to a third line width threshold.

11. The display substrate according to claim 9, wherein the second signal lines are configured to supply gate drive signals, and each of the second signal lines comprises a gate line lead and a gate line connected to each other;
wherein the gate line lead is arranged in the pad region and the first lead region; or the gate line lead is arranged in the pad region and the second lead region; and
the gate line is arranged in the display region, and connected to at least one of the pixels.

12. The display substrate according to claim 11, wherein each of the second signal lines comprises a first metal layer and a second metal layer, wherein the first metal layer and a first gate metal layer in the display substrate are arranged in the same layer, and the second metal layer and a second gate metal layer in the display substrate are arranged in the same layer; or
each of the second signal lines comprises a first metal layer, a second metal layer and a third metal layer, wherein the first metal layer and a first gate metal layer in the display substrate are arranged in the same layer, the second metal layer and a second gate metal layer in the display substrate are arranged in the same layer, and the third metal layer and the source/drain metal layer in the display substrate are arranged in the same layer.

13. The display substrate according to claim 12, wherein the plurality of first signal lines comprise a data signal line configured to supply a data signal, and/or a second power line configured to supply a second direct-current power signal; wherein
each of the data signal lines comprises a data line lead and a data line connected to each other, wherein the data line lead is arranged in the pad region and the bending region, and the data line is arranged in the display region and connected to at least one of the pixels; and
the data signal line and the first gate metal layer in the display substrate are arranged in the same layer, or the data signal line and the second gate metal layer in the display substrate are arranged in the same layer;
a line width of each of the second power lines is less than or equal to a second line width threshold, and a line width of each of the second signal lines is less than or equal to a third line width threshold;
each type of the signal lines comprises at least one target signal line, wherein the target signal line is arranged close to an edge of the pad region relative to other signal lines except the target signal line, a portion, in the pad region, of the target signal line comprises a first target sub-line segment and a second target sub-line segment which are sequentially connected, wherein the first target sub-line segment is arranged close to the display region relative to the second target sub-line segment, and an angle between the first target sub-line segment and a boundary line, extending along the first direction, of the display region is less than or equal to 90 degrees;
the pad region comprises a first section and a second section which are symmetrical, wherein for each type of the signal lines, part of the signal lines are arranged in the first section, and the remaining signal lines are arranged in the second section; for each type of the signal lines, a quantity of the signal lines in the first section is equal to a quantity of the signal lines in the second section; and in each of the sections, a target line group, the second power line, and the second signal line are sequentially arranged along a direction going distally from the other section, wherein the target line group comprises the data signal line and the first power line; and the base substrate further comprises a component arrangement region, wherein the component arrangement region and the pad region are arranged on a same side of the display region; the display substrate further comprises a camera component in the component arrangement region; and the pad region comprises a first portion and a second portion connected to each other on a side close to the component arrangement region, wherein an extending direction of the first portion is intersected with an extending direction of the second portion.

14. The display substrate according to claim 1, wherein the display substrate further comprises a plurality of second signal lines, and the first signal line comprises a data signal line and a second power line;

the pad region comprises a first section and a second section which are symmetrical; and for each type of the signal lines, part of the signal lines are arranged in the first section, and the remaining signal lines are arranged in the second section.

15. The display substrate according to claim 14, wherein for each type of the signal lines, a quantity of signal lines in the first section is equal to a quantity of signal lines in the second section.

16. The display substrate according to claim 14, wherein in each of the sections, a target line group, the second power line, and the second signal line are sequentially arranged along a direction going distally from the other section, wherein the target line group comprises the data signal line and the first power line.

17. The display substrate according to claim 1, wherein the base substrate further comprises a component arrangement region, wherein the component arrangement region and the pad region are arranged on a same side of the display region;

the display substrate further comprises a camera component in the component arrangement region; and the pad region has a first portion and a second portion connected to each other on a side close to the component arrangement region, wherein an extending direction of the first portion is intersected with an extending direction of the second portion.

18. A display substrate, comprising:

a base substrate comprising a display region, a bending region and a pad region, wherein a length of the display region in a first direction is greater than a length of the display region in a second direction, wherein the first direction is perpendicular to the second direction, and the pad region, the bending region, and the display region are arranged along the second direction;

a plurality of pixels arranged in an array and disposed in the display region; and a plurality of first power line groups and a plurality of first signal lines, wherein each of the first power line groups comprises at least two first power lines configured to supply a first direct-current power signal, wherein each of the first power lines and each of the first signal lines extend from the pad region to the display region and are connected to at least one of the pixels, and extending directions of part of line segments for connecting the pixels to each of the first power lines and each of the first signal lines are all parallel to the second direction;

wherein each type of the signal lines comprises at least one target signal line, wherein the target signal line is arranged close to an edge of the pad region relative to other signal lines except the target signal line;

a portion, in the pad region, of the target signal line comprises a first target sub-line segment and a second target sub-line segment which are sequentially connected, wherein the first target sub-line segment is arranged close to the display region relative to the second target sub-line segment, and an angle between the first target sub-line segment and a boundary line, extending along the first direction, of the display region is less than or equal to 90 degrees.

19. A display device, comprising a drive circuit in a pad region, and the display substrate according to claim 18;

wherein the drive circuit is connected to all types of signal lines in the display substrate, and configured to supply signals to the connected signal lines.

20. A display device, comprising a drive circuit in a pad region, and a display substrate;

wherein the display substrate comprises:

a base substrate comprising a display region, a bending region and a pad region, wherein a length of the display region in a first direction is greater than a length of the display region in a second direction, wherein the first direction is perpendicular to the second direction, and the pad region, the bending region, and the display region are arranged along the second direction;

a plurality of pixels arranged in an array and disposed in the display region;

a first bridging portion in the pad region and a second bridging portion in the display region; and a plurality of first power line groups and a plurality of first signal lines, wherein each of the first power line groups comprises at least two first power lines configured to supply a first direct-current power signal, wherein each of the first power lines and each of the first signal lines extend from the pad region to the display region and are connected to at least one of the pixels, and extending directions of part of line segments for connecting the pixels to each of the first power lines and each of the first signal lines are all parallel to the second direction; each of the first power lines comprises a first sub-line segment, a second sub-line segment, and a third sub-line segment; wherein the first sub-line segment is arranged in the pad region, wherein one end of the first sub-line segment is connected to a power supply terminal, and the other end of the first sub-line segment is connected to the first bridging portion; one end of the second sub-line segment is connected to the first bridging portion, and the other end of the second sub-line segment is connected to the second bridging portion; and one end of the third sub-line segment is connected to the second bridging portion, and the other end of the third sub-line segment is connected to at least one of the pixels; wherein the first sub-line segment, the second sub-line segment, the third sub-line segment, the first bridging portion, and the second bridging portion are all arranged in the same layer as a source/drain metal layer in the display substrate;

wherein the drive circuit is connected to all types of signal lines in the display substrate, and configured to supply signals to the connected signal lines. .

* * * * *